(12) United States Patent
Lee et al.

(10) Patent No.: US 8,196,020 B2
(45) Date of Patent: Jun. 5, 2012

(54) METHOD OF MATCHING CODEWORD SIZE AND TRANSMITTER THEREFOR IN MOBILE COMMUNICATIONS SYSTEM

(75) Inventors: Young Seob Lee, Gyeonggi-do (KR); Min Seok Oh, Seoul (KR); Ji Wook Chung, Gyeonggi-do (KR); Ki Hyoung Cho, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 800 days.

(21) Appl. No.: 12/278,760

(22) PCT Filed: Jan. 31, 2007

(86) PCT No.: PCT/KR2007/000531
§ 371 (c)(1),
(2), (4) Date: Jan. 20, 2009

(87) PCT Pub. No.: WO2007/091797
PCT Pub. Date: Aug. 16, 2007

(65) Prior Publication Data
US 2009/0307562 A1     Dec. 10, 2009

(30) Foreign Application Priority Data
Feb. 8, 2006 (KR) .................. 10-2006-0012220

(51) Int. Cl.
*H03M 13/00* (2006.01)
(52) U.S. Cl. .......................... 714/776; 714/774
(58) Field of Classification Search .................. 714/776, 714/774
See application file for complete search history.

(56) References Cited

U.S. PATENT DOCUMENTS

| | | | |
|---|---|---|---|
| 7,882,418 B2* | 2/2011 | Lee et al. | 714/758 |
| 2004/0170430 A1* | 9/2004 | Gorokhov | 398/41 |
| 2004/0194007 A1* | 9/2004 | Hocevar | 714/801 |
| 2005/0289437 A1* | 12/2005 | Oh et al. | 714/758 |
| 2006/0020868 A1* | 1/2006 | Richardson et al. | 714/752 |
| 2006/0020872 A1* | 1/2006 | Richardson et al. | 714/758 |
| 2006/0036923 A1* | 2/2006 | Hedberg et al. | 714/752 |

FOREIGN PATENT DOCUMENTS

| | | |
|---|---|---|
| CN | 1443399 | 9/2003 |
| WO | 0197387 | 12/2001 |

(Continued)

OTHER PUBLICATIONS

Y. Li et al., "Bit-Reliability Mapping in LDPC-Coded Modulation Systems," IEEE Communications Letters, vol. 9, No. 1, Jan. 2005, XP-001211457.

(Continued)

*Primary Examiner* — M. Mujtaba K Chaudry
(74) *Attorney, Agent, or Firm* — Lee, Hong, Degerman, Kang & Waimey (57) ABSTRACT

The present invention relates to a method and a transmitter for matching a size of codeword encoded by low density parity check (LDPC) code to a size of a transmission channel and in a mobile communication system. A method of adjusting a codeword size in a communication system supporting an LDPC coding scheme, comprises steps of encoding source data by using a parity check matrix, and adjusting a size of the encoded codeword to be matched to a size of a transmission channel which is determined in accordance with a capacity of the transmission channel, the size of the encoded codeword being adjusted using information associated with column weights of the parity check matrix.

8 Claims, 5 Drawing Sheets

FOREIGN PATENT DOCUMENTS

| WO | 2004114526 | 12/2004 |
|----|------------|---------|
| WO | 2005015748 | 2/2005  |

OTHER PUBLICATIONS

B. Classon et al., "LDPC Coding for OFDMA PHY," IEEE 802.16 Broadband Wireless Access Working Group, IEEE C802.16e-04/372, Aug. 2004, XP-002593119.

J. Ha, "Low-Density Parity-Check Codes with Erasures and Puncturing," Georgia Institute of Technology Thesis, Nov. 2003, XP-002593120.

Y. Li et al., "Bit-to-Symbol Mapping in LDPC Coded Modulation," IEEE 61st Vehicular Technology Conference, vol. 1, pp. 683-86, May 2005, XP-002593121.

\* cited by examiner

FIG. 1

PRIOR ART

$$H = \begin{pmatrix} 1 & 0 & 0 & 0 & 0 & 1 & 0 & 0 & 0 & 0 & 1 & 1 \\ 1 & 0 & 1 & 1 & 0 & 0 & 1 & 0 & 0 & 0 & 1 & 0 \\ 0 & 1 & 1 & 0 & 1 & 0 & 1 & 0 & 1 & 1 & 1 & 0 \\ 1 & 0 & 0 & 1 & 1 & 1 & 0 & 1 & 0 & 0 & 1 & 0 \\ 1 & 0 & 1 & 0 & 0 & 1 & 0 & 1 & 0 & 1 & 1 & 1 \\ 1 & 0 & 1 & 0 & 1 & 0 & 1 & 0 & 1 & 0 & 1 & 0 \end{pmatrix}$$

METHOD OF MATCHING CODEWORD SIZE AND TRANSMITTER THEREFOR IN MOBILE COMMUNICATIONS SYSTEM

CROSS-REFERENCE TO RELATED APPLICATIONS

This application is the National Stage filing under 35 U.S.C. 371 of International Application No. PCT/KR2007/000531, filed on Jan. 31, 2007, which claims the benefit of earlier filing date and right of priority to Korean Application No. 10-2006-0012220, filed on Feb. 8, 2006.

BACKGROUND ART

The present invention relates to a wireless communication system. More particularly, the present invention relates to a method and a transmitter for matching a size of codeword encoded by low density parity check (LDPC) code to a size of a transmission channel in a wireless communication system.

TECHNICAL FIELD

A transmitting side performs a channel coding process for data to be transmitted to a receiving side for diminishing loss or distortion during transmission on a radio channel in a wireless communication system. At least two channel-coded data bits are mapped to a symbol to be transmitted through the radio channel. A process by which the at least two channel-coded data bits are mapped to a symbol is called digital modulation.

Data modulated by the digital modulation is transmitted through the radio channel to the receiving side. The transmitted signals can be distorted during transmission through the radio channel due to fading and thermal noises. The receiving side receives the distorted signals and performs the procedures performed by the transmitting side in reverse. In other words, a demodulation process by which symbols are de-mapped into data bits and a channel decoding process by which the distorted data is recovered into the original data are performed.

As a modulation scheme, one of Binary Phase Shift Keying (BPSK), Quadrature Phase Shift Keying (QPSK), 16-Qaudrature Amplitude Modulation (QAM), 64-QAM, and 256-QAM, etc can be used. In case of the 16-QAM, 4 bits of channel-encoded data are mapped to one symbol by the modulation in the transmitting side and one symbol is de-mapped into 4 data bits by the demodulation in the receiving side.

The channel coding is a procedure by which parity bits are added to input data bits in the transmitting side, so that the receiving side can find errors occurred during transmission due to noises and interferences on a transmission channel and recover received signals having the errors. Convolutional code, turbo code and LDPC code, etc can be used for the channel coding and decoding. An LDPC coding scheme will be described as follows.

A parity check matrix H which is used for generating parity bits and a parity check generation matrix G which can be derived from the parity check matrix are stored in an encoder for the LDPC coding. A channel decoder in a receiving side decodes received data comprising systematic bits and parity bits distorted during transmission by using decoding algorithms and the parity check matrix and repeats the decoding algorithms until the systematic bits are recovered.

In encoding and decoding schemes using the LDPC code, linear code can be described with the parity check generation matrix G and the parity check matrix H. A characteristic of the linear code is that the equation of $Hc^T=0$ is satisfied for every bit of a codeword 'c'. As one of the linear code, the LDPC code which is recently paid attention to was proposed by Gallager in 1962 for the first time. One of the characteristics of the LDPC coding is that most of elements of the parity check matrix H are '0' and the number of elements which are not '0' is small compared to the codeword, so that repetitive decoding based on probability is possible. A parity check matrix H for the first proposed LDPC code was defined in a non-systematic form and each row and columns of the parity check matrix were designed to equally have a small weight. Here, the weight means the number of '1' included in each row and column.

The LDPC coding scheme has low decoding complexity since a density of elements which are not '0' in the parity check matrix H is low. Further, decoding performance of the LDPC coding is superior to other coding schemes, which is adjacent to the theoretical limit of Shannon. However, the LDPC coding scheme could not be implemented with the hardware technique at the time of proposal by Gallegar, so that has not been paid attention to by the people for 30 years. A repetitive decoding scheme using graphs was developed in early 1980's and a couple of decoding algorithms for the LDPC code have been developed using the repetitive decoding scheme. One of them is a sum-product algorithm.

The LDPC coding has a superior error correction capability thereby improving communication speed and capacity. When combined with a multi-input and multi-output (MIMO) scheme, the LDPC coding can be applied to a high speed wireless LAN having a data transmission speed of several hundred Mbit/s, a high speed mobile communication system having a data transmission speed of one Mbit/s for a user moving at a speed of 250 km/h, and a optical communication system having a data transmission speed of 40 Gbit/s. In addition, the LDPC coding can enable a quantum encryption communication diminishing the number of retransmission on a communication path having low quality to be possible since transmission quality is improved due to its high error correction capability. Further, data packets having errors can be easily recovered due to the low complexity and superior loss compensation capability of the LDPC coding, so that contents having quality equal to TV can be transmitted through the Internet and the mobile communication system. 10G BASE-T transmission within a range of 100 m which has been considered impossible earlier can be realized owing to wide application range and large capacity which are advantages of the LDPC coding. In addition, transmission capacity of a single satellite transmitter having 36 MHz bandwidth can be increased up to 80 Mbit/s which is 1.3 times of usual transmission capacity. With the above described advantages, the LDPC coding scheme is adopted as a next generation coding scheme in a communication system, like IEEE 802.16 or IEEE 802.11, etc.

With a general LDPC coding scheme, information bits are encoded by using a parity check generation matrix G derived from a parity check matrix H. For generating the generation matrix G, the parity check matrix H is configured in the form of $[P^T: I]$ by using a Gaussian reduction method. Assuming the number of the information bits is 'k' and a size of a codeword is 'n', the 'P' is a matrix having 'k' number of rows and '(n−1)' number of columns and the 'I' is an identity matrix having 'k' number of rows and columns.

When the parity check matrix H is represented in the form of $[P^T:I]$, the generation matrix G has the form of $[I:P]$. The information bits to be encoded can be represented as a matrix 'x' having one row and 'k' number of columns. In this case, the codeword 'c' is represented in the form of the following equation.

$$c = xG = [x:xP]$$

A decoder in a receiving side decodes the codeword 'c' which is the result of encoding in a transmitting side to obtain the information bits 'x' by using an equation of $cH^T=0$ which is one of characteristics of the LDPC coding scheme. More particularly, the decoder calculates $c'H^T$ where "c'" is a received codeword. When the calculating result is zero, the decoder decodes the codeword to recover the information bits 'x'. If the calculating result is not zero, the decoder search for "c'" with which the result of $c'H^T$ is zero by using an algorithm like a sum-product algorithm using graphs and then recover the information bits 'x'.

A method of allocating radio resources in a wireless access system based on orthogonal frequency division multiplexing (OFDM) will be described as follows.

Figure 1:
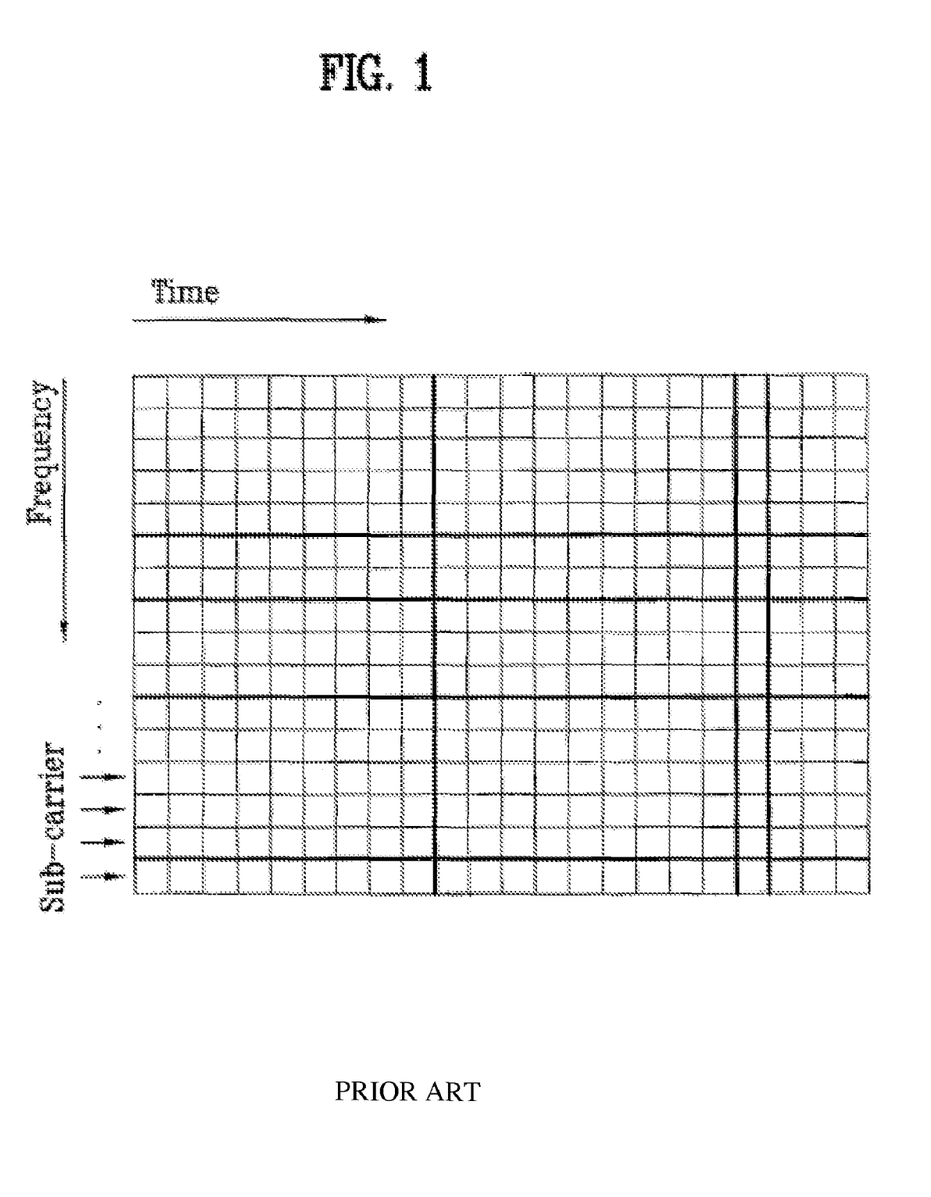
FIG. 1 is a schematic diagram illustrating transmission channels of an OFDM-based wireless access system.

In the OFDM-based wireless access system, radio resources necessary for data transmission are allocated in the unit of a sub-channel which is a set of a plurality of sub-carriers. For example, in a system based on the IEEE 802.16e which is a standard for an OFDM-based broadband wireless access system, a sub-channel comprises 48 sub-carriers. FIG. 1 is a schematic diagram illustrating transmission channels of an OFDM-based wireless access system. A sub-channel is comprised of 48 lattices. When a QPSK scheme is used in a sub-channel for modulation, 96 data bits can be transmitted through the sub-channel. When 16-QAM or 64-QAM is used, 192 or 288 data bits can be transmitted, respectively.

As described above, a radio channel on which a user transmits data is allocated in the unit of a sub-channel in the OFDM-based system like IEEE 802.16e. Accordingly, a size of encoded data by an encoder should be determined considering a size of sub-channels allocated for data transmission, resulting in the following problems.

First, the size of a parity check matrix H which is used for the LDPC coding and decoding is limited. Namely, in the parity check matrix H having a dimension of m×n, the 'n' which is the size of a codeword to be transmitted should be integer times of the size of the sub-channel, so that the configuration of the matrix H is limited.

Second, although the size of the codeword outputted from an LDPC encoder is integer times of the size of the sub-channel, some modulation schemes are limited to be used. For example, in the IEEE 802.16e system supporting all of QPSK, 16-QAM, and 64-QAM as modulation schemes, the size of data to be transmitted on one sub-channel is (the number of sub-channels×2) in case of QPSK, (the number of sub-channels×4) in case of 16-QAM, and (the number of sub-channels×6) in case of 64-QAM. Accordingly, three modulation schemes can be used together only when the size of data to be transmitted on one sub-channel is a common multiple of the above-mentioned three sizes. Table 1 represents the sizes of the codeword outputted the LDPC encoder which are supportable in the IEEE 802.16e system, which shows some codeword sizes fail to support all three modulation schemes.

TABLE 1

| N (bits) | n (bytes) | z factor | k(bytes) | | | No. of sub-channels | | |
| --- | --- | --- | --- | --- | --- | --- | --- | --- |
| | | | R = ½ | R = ⅔ | R = ¾ | QPSK | 16QAM | 64QAM |
| 576 | 72 | 24 | 36 | 48 | 54 | 6 | 3 | 2 |
| 672 | 84 | 28 | 42 | 56 | 63 | 7 | — | — |
| 768 | 96 | 32 | 48 | 64 | 72 | 8 | 4 | — |
| 864 | 108 | 36 | 48 | 64 | 72 | 8 | 4 | — |
| 960 | 120 | 40 | 60 | 80 | 90 | 10 | 5 | — |
| 1056 | 132 | 44 | 66 | 88 | 99 | 11 | — | — |
| 1152 | 144 | 48 | 72 | 96 | 108 | 12 | 6 | 4 |
| 1248 | 156 | 52 | 78 | 104 | 117 | 13 | — | — |
| 1344 | 168 | 56 | 84 | 112 | 126 | 14 | 7 | — |
| 1440 | 180 | 60 | 90 | 120 | 135 | 15 | — | 5 |
| 1536 | 192 | 64 | 96 | 128 | 144 | 14 | 8 | — |
| 1632 | 204 | 68 | 102 | 136 | 153 | 17 | — | — |
| 1728 | 216 | 72 | 108 | 144 | 162 | 18 | 9 | 6 |
| 1824 | 228 | 76 | 114 | 152 | 171 | 19 | — | — |
| 1920 | 240 | 80 | 120 | 160 | 180 | 20 | 10 | — |
| 2016 | 252 | 84 | 126 | 168 | 189 | 21 | — | 7 |
| 2112 | 264 | 88 | 132 | 176 | 198 | 22 | 11 | — |
| 2208 | 276 | 92 | 138 | 184 | 207 | 23 | — | — |
| 2304 | 288 | 96 | 144 | 192 | 216 | 24 | 12 | 8 |

With the above-described problems, when the size of the codeword to be transmitted is not identical to the data size which can be transmitted through allocated sub-channels, additional sub-channels are to be allocated. However, when the data size of transmission channel is larger than the size of data to be transmitted by allocating the additional sub-channels, dummy bits (0 or 1) which are necessary for filling a remainder part of the allocated sub-channels are needed, which deteriorates decoding capability and makes radio resources wasted.

DISCLOSURE OF INVENTION

The present invention is directed to a method and a transmitter for adjusting a size of a codeword outputted from an LDPC encoder, if necessary, that substantially obviate one or more of the problems due to limitations and disadvantages of the related art.

An object of the present invention is to provide a method and a receiver for adjusting a size of codeword, thereby optimizing decoding performance by considering characteristics of the parity check matrix H.

One of characteristics of an embodiment of the present invention is to adjust a size of a codeword encoded by an LDPC coding scheme to a size of allocated sub-channels by using features of a parity check matrix H. When the parity check matrix H has the form of $[P^T:I]$, the number of information bits is 'k', and a size of the codeword is 'n', 'P' is a matrix having 'k' number of rows and '(n−k)' number of columns and 'I' is an identity matrix having 'k' number of rows and columns. Namely, the codeword size is identical to the number of columns of the parity check matrix H and each bit of the codeword corresponds to each column of the parity check matrix H.

The number of '1' included in each row and column of the parity check matrix H is called a weight of the row and column. Generally, in the LDPC coding scheme, an encoded bit corresponding to a row or column having bigger weight has better decoding capability, on the other hand a encoded bit corresponding to a row or column having smaller weight has worse decoding capability.

Figure 2:
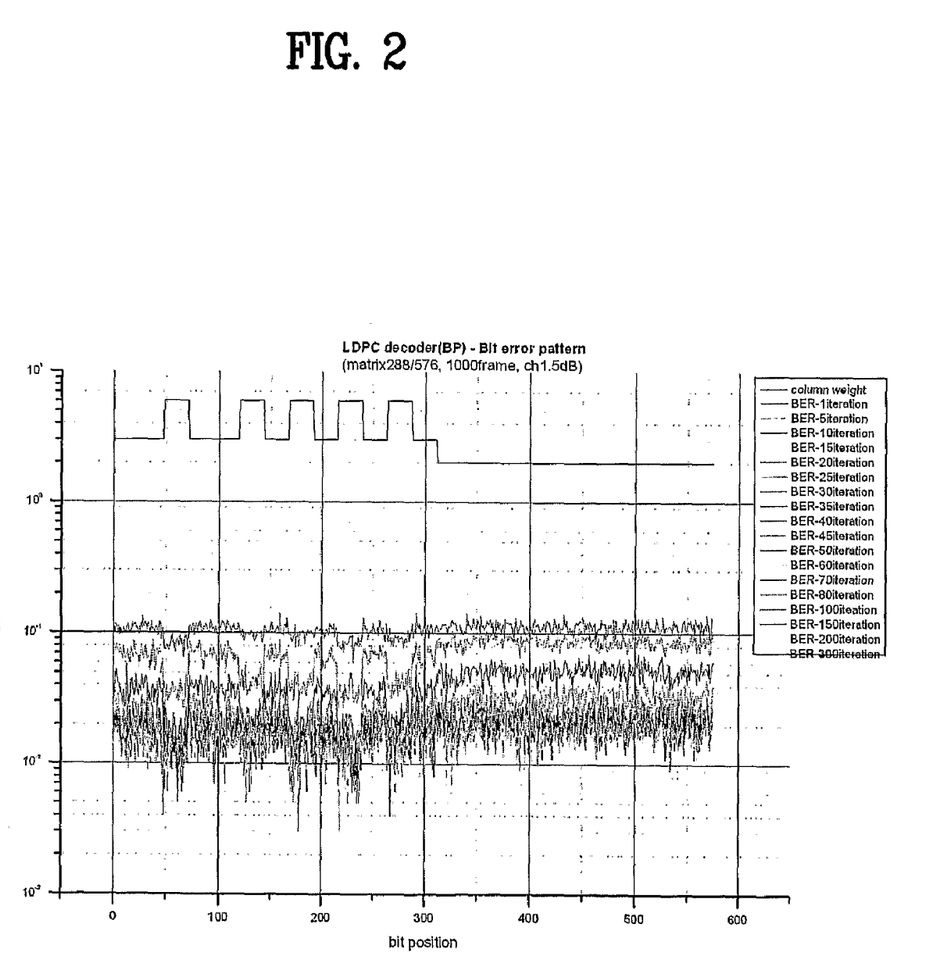
FIG. 2 is a diagram illustrating error probability per position of each data bit to be transmitted in accordance with distribution of a parity check matrix H and iteration number of decoding.

FIG. 2 is a diagram illustrating error probability per position of each data bit to be transmitted in accordance with distribution of a parity check matrix H and iteration number of decoding. In FIG. 2, the x-axis represents each bit position of a codeword to be transmitted having a size of 576 and the y-axis represents bit error rate (BER) for each position. The solid line located at the upper portion of FIG. 2 represents column weights of the parity check matrix H. There are three steps of the column weights which are 2, 3, and 6 in an example in FIG. 2. Each curved line corresponding to each decoding iteration number in a decoder of a receiving side represents bit error rates (BERs) for all bit positions. The curved lines go below as the decoding iteration number increases in FIG. 2, which means that a bit error rate (BER) for a same bit position is getting lower as the decoding iteration number increases. When considering a same decoding iteration number, it is noted that a bit location corresponding to a column having a greater weight which is equal to six has a lower bit error rate (BER) than a bit location corresponding to a column having a smaller weight which is two or three.

Figure 3:
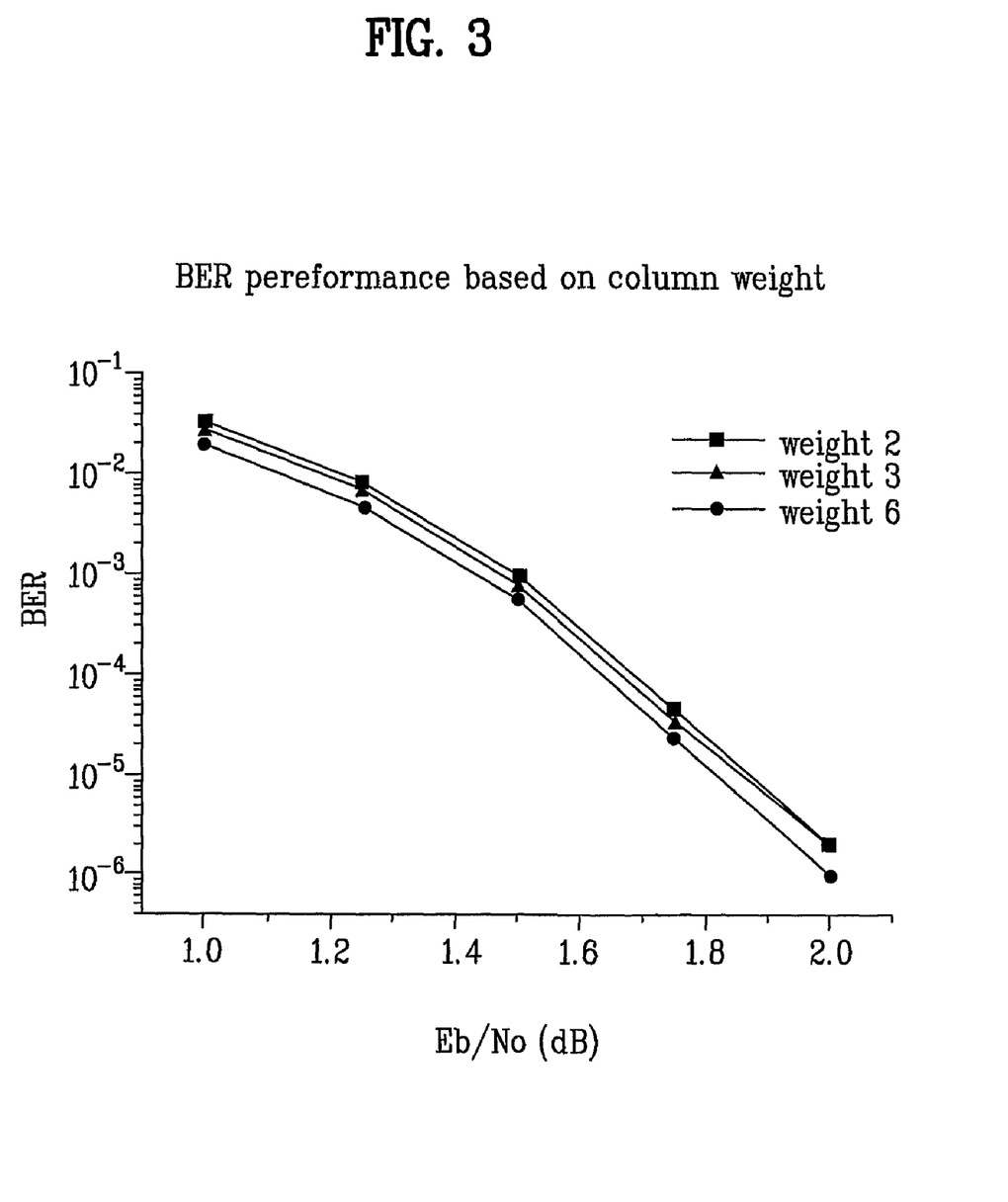
FIG. 3 is a diagram illustrating bit error rates (BERs) of data encoded by the LDPC coding when the column weights are 2, 3, and 6.

FIG. 3 is a diagram illustrating bit error rates (BERs) of data encoded by the LDPC coding when the column weights are 2, 3, and 6. As shown in FIGS. 2 and 3, a bit error rate (BER) corresponding to a position having a greater column weight is lower than that of a position having a smaller column weight.

When a codeword size encoded by the LDPC coding is not identical to a size of a transmission channel, it is desirable to adjust the codeword size to be matched to the size of the transmission channel. Here, the size of the transmission channel can be defined as a size of data which can be transmitted on the transmission channel from a transmitting side to a receiving side at a time, which differs according to communication systems. The size of the transmission channel in an OFDM-based system will be described below.

A codeword encoded by an LDPC coding is mapped to symbols by a digital modulation scheme. QPSK, 16-QAM or 64-QAM can be used as the digital modulation scheme. Modulated symbols are transmitted to a receiving side through available sub-channels. The size of the transmission channel in the OFDM-based system can be determined based on a digital modulation scheme used in a transmitting side, the number of available sub-channels, and the number of sub-carriers allocated to each sub-channel. The size of the transmission channel is variable since the digital modulation scheme, the number of available sub-channels, and the number of sub-carriers allocated to each sub-channel, etc can be changed in accordance with channel circumstances, etc. Accordingly, a codeword size encoded by an LDPC coding scheme needs to be matched to the size of the transmission channel which is variable with circumstances.

Some bits of the codeword are to be punctured in case that the codeword size is greater than the size of the transmission channel and some bits of the codeword are to be repeated in case that the codeword size is smaller than the size of the transmission channel, so that the codeword size can be matched to the size of the transmission channel. The characteristics of the LDPC coding described above with reference to FIGS. 2 and 3 are preferably considered when performing the puncturing and the repetition. Namely, encoded bits which correspond to columns having smaller weights, thereby having greater error probability are to be punctured. Encoded bits which correspond to columns having greater weights, thereby having smaller error probability are to be repeated. In addition, when performing the puncturing and the repetition, whether an encoded bit is a systematic bit or a parity bit is to be considered. Encoded bits which belong to parity bits and correspond to columns having smaller weight are preferentially to be punctured. Encoded bits which belong to systematic bits and correspond to columns having greater weight are preferably to be repeated.

To achieve these objects and other advantages and in accordance with the purpose of the invention, as embodied and broadly described herein, in one embodiment, a method of adjusting a codeword size in a communication system supporting an LDPC coding scheme, comprises steps of encoding source data by using a parity check matrix, and adjusting a size of the encoded codeword to be matched to a size of a transmission channel which is determined in accordance with a capacity of the transmission channel, the size of the encoded codeword being adjusted using information associated with column weights of the parity check matrix.

In accordance with another embodiment of present invention, a transmitter in a communication system supporting an LDPC coding scheme, comprises an LDPC coding module adapted to encode source data by using a parity check matrix, and an adjusting module adapted to adjust a size of the encoded codeword to be matched to a size of a transmission channel which is determined in accordance with a capacity of the transmission channel, the size of the encoded codeword being adjusted using information associated with column weights of the parity check matrix.

BEST MODE FOR CARRYING OUT THE INVENTION

Reference will now be made in detail to the preferred embodiments of the present invention, examples of which are illustrated in the accompanying drawings, thereby clarifying structures, operations, and other characteristics of the present invention.

Figure 4A:
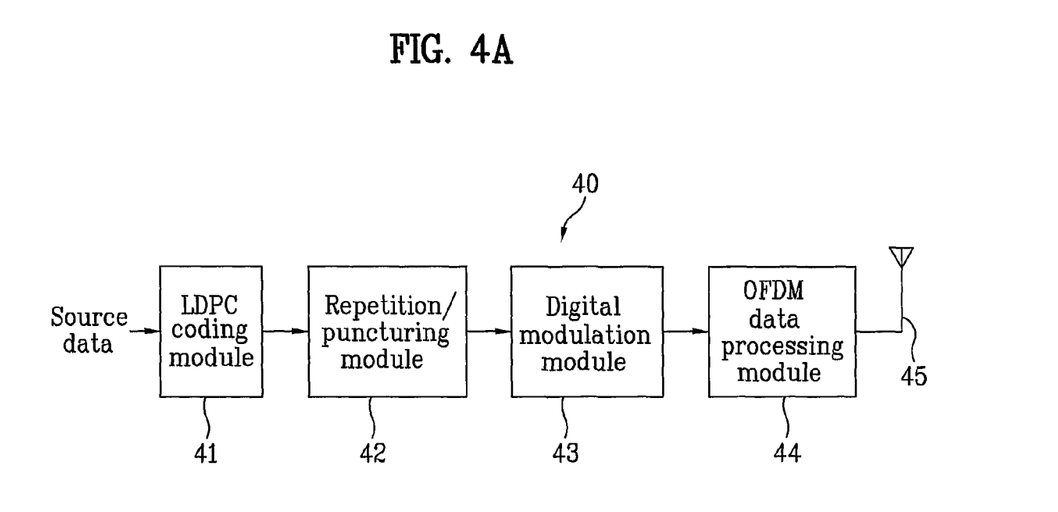
FIGS. 4A and 4B are structural diagrams illustrating a transmitter and a receiver in accordance with one preferred embodiment of the present invention, respectively.
Figure 4B:
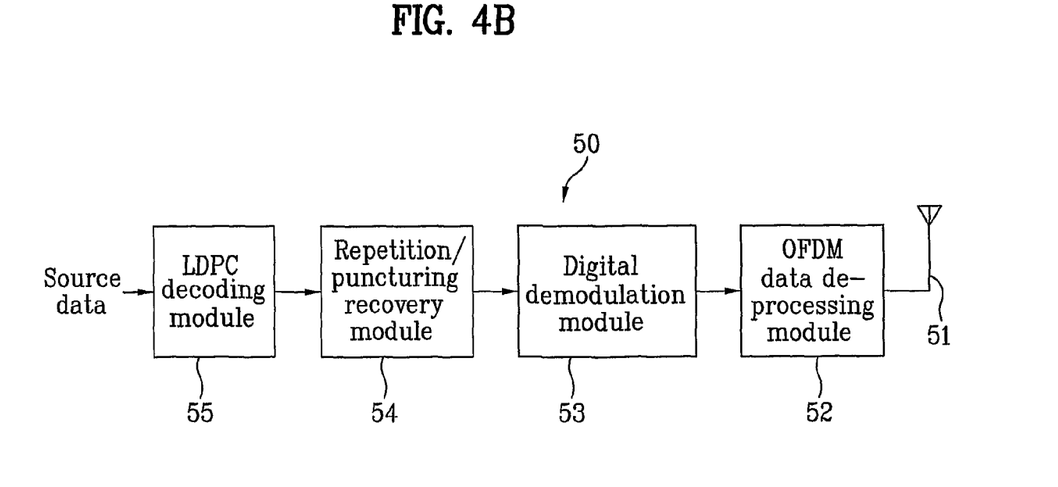

FIGS. 4A and 4B are structural diagrams illustrating a transmitter and a receiver in accordance with one preferred embodiment of the present invention, respectively. The embodiment of FIGS. 4A and 4B are examples in which the technical features of the present invention are applied to an OFDM-based mobile communication system.

Referring to FIG. 4A, the transmitter 40 in accordance with one preferred embodiment of the present invention comprises an LDPC coding module 41 encoding source data by using LDPC coding, a repetition/puncturing module 42 adjusting a size of codeword outputted from the LDPC coding module 41 to be matched to a size of a transmission channel by repetition or puncturing, a digital modulation module 43 mapping data bits outputted from the repetition/puncturing module 42 to a symbol by digital modulation, an OFDM data processing module 44 performing OFDM modulation for a symbol sequence outputted from the digital modulation module 43, and an antenna 45 transmitting signals outputted from the OFDM data processing module 44.

The LDPC encoding module 41 may encode the source data by using a generation matrix G. More particularly, the source data $s_{1 \times k}$ is encoded by the equation of c=xG=[x: xP] to be a codeword $x_{1 \times k}$. The codeword x has a form of x=[s p]=[$s_0, s_1, \ldots, s_{k-1}, p_0, p_1, \ldots, p_{m-1}$], where ($p_0, p_1, \ldots, p_{m-1}$) are parity bits and ($s_0, S_1, \ldots, s_{k-1}$) are systematic bits.

The encoding scheme using the generation matrix G is very complicated. Accordingly, recently researches for coding schemes encoding the source data by directly using a parity check matrix H, not the generation matrix G have made progress in order to diminish such complexities.

The repetition/puncturing module 42 adjusts 'n' bits of the codeword outputted from the LDPC coding module to be matched to the size of the transmission channel by repeating or puncturing some bits of the codeword. Namely, the repetition/puncturing module 42, when the size of the codeword outputted from the LDPC coding module is smaller than the size of the transmission channel, performs the repetition for some bits amounting to a difference between the size of the codeword and the size of the transmission channel, and when the size of the codeword is greater than the size of the transmission channel, performs the puncturing for some bits amounting to the difference, so that the size of the codeword can be matched to the size of the transmission channel.

As described above, the size of the transmission channel means a data size which can be transmitted on the transmission channel at a time and can be determined based on a digital modulation scheme used in the OFDM system, the number of allocated sub-channels and the number of sub-carriers allocated to a sub-channel. In a system based on IEEE 802.16e, the size of the transmission channel can be variable since an adaptive modulation scheme is adopted, so that different digital modulation schemes can be used according to channel conditions and since the number of sub-channel which are available by a base station or are allocated a mobile station.

First, a procedure for adjusting the codeword size by repetition in the repetition/puncturing module 42 will be described below.

When the size of the codeword outputted from the LDPC coding module 41 is 'n' bits and the size of the transmission channel is 't' bits where n<t, the size of the codeword should be adjusted to be matched to the size of the transmission channel by repeating (t-n) number of bits among the codeword. The codeword, as described above, comprises the systematic bits and the parity bits and bits to be repeated are preferably selected among the systematic bits in consideration of a column weight of the parity check matrix H corresponding to each bit. It is desirable that some of the systematic bits are repeated since the systematic bits correspond to the source data and the parity bits are redundancy bits with which a receiving side executes error detection and correction. Further, bits are preferably to be repeated in a descending order from a bit corresponding to a column having the biggest weight since the bigger a column weight is, the more a corresponding bit has robustness to errors during transmission. Some of the parity bits may be repeated in case that the size of the codeword cannot be matched to the size of the transmission channel with the systematic bits only.

Figure 5:
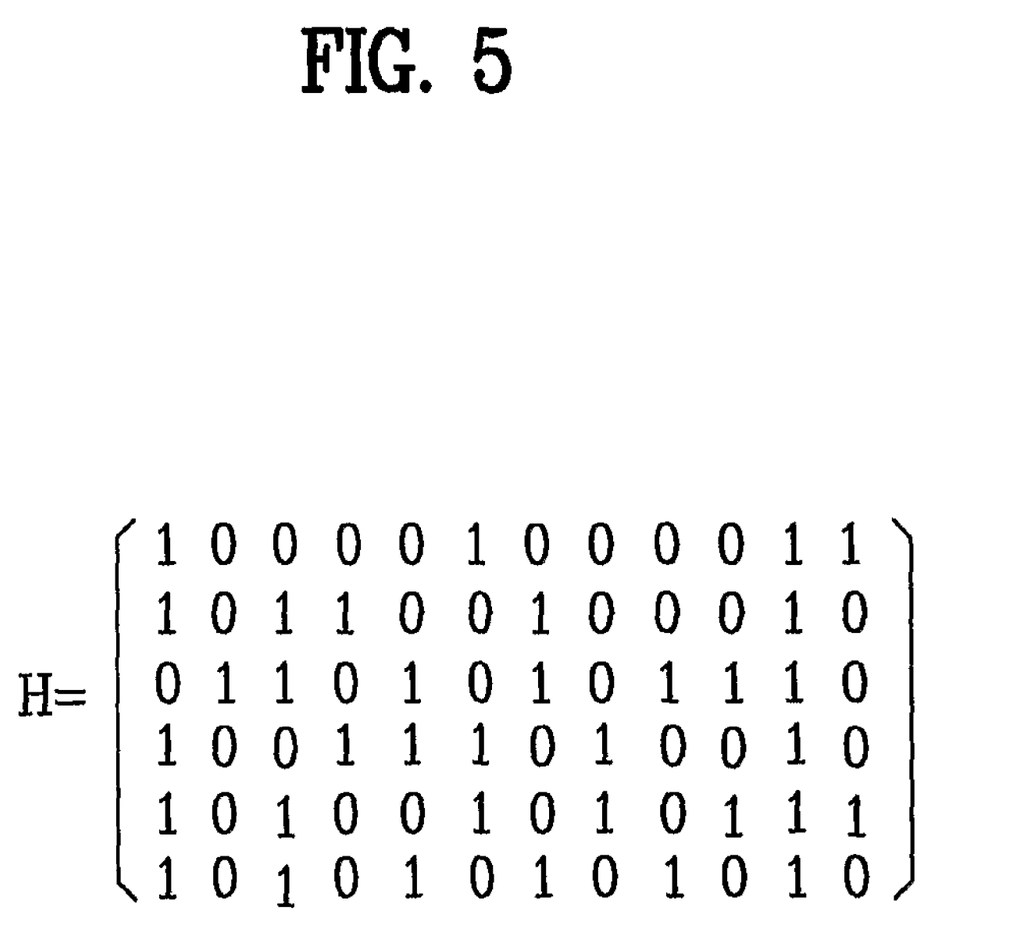
FIG. 5 is a diagram illustrating an example of the parity check matrix.

FIG. 5 is a diagram illustrating an example of the parity check matrix having a dimension of 6×12. A procedure for adjusting a size of a codeword to a size of a transmission channel by repeating some of the codeword encoded by the parity check matrix in FIG. 5 will be described as follows. The parity check matrix in FIG. 5 is just an example for describing an embodiment of the present invention and the dimension of the parity check matrix used during actual implementation is much bigger than the example of FIG. 5.

In the parity check matrix H of FIG. 5, assuming that a weight of the $k^{th}$ column is $W_k$, then a weight of each column of the parity check matrix is $W_1$=5, $W_2$=1, $W_3$=4, $W_4$=2, $W_5$=3, $W_6$=3, $W_7$=3, $W_8$=2, $W_9$=2, $W_{10}$=2, $W_{11}$=6, and $W_{12}$=2. When encoding the source data of 6 bits by using the parity check matrix H, 12 bits of codeword is outputted. Assuming that each bit of the codeword is $a_k$, where $a_k$ is 1 or −1 and k=1, 2, . . . , 12, $a_1$~$a_6$ are systematic bits and $a_7$~$a_{12}$ are parity bits. The systematic bits reordered in a descending order according to the weight of each column $W_k$ are $a_1, a_3, a_5, a_6, a_4$, and $a_2$. If a size of a transmission channel is 15 bits, the top three bits corresponding to three columns having the biggest weights among the systematic bits are repeated. Assuming the three repeated bits are $b_1, b_3$, and $b_6$ where $b_k$=$a_k$, the bits to be transmitted are $a_2, a_3, a_4, a_5, a_6, a_7, a_8, a_8, a_9, a_{10}, a_{11}, a_{12}, b_1, b_3$, and $b_5$. If a size of the transmission channel is 20 bits, all systematic bits and the top two bits ($a_{11}, a_7$) corresponding to two columns having the biggest weights among the parity bits are repeated. Assuming the eight repeated bits are $b_1, b_2, b_3, b_4, b_5, b_6, b_{11}$, and $b_7$ where $b_k$=$a_k$, the bits to be transmitted are $a_1, a_2, a_3, a_4, a_5, a_6, a_7, a_8, a_9, a_{10}, a_{11}, a_{12}, b_1, b_2, b_3, b_4, b_5, b_6, b_{11}$, and $b_7$.

As another embodiment, bits to be repeated can be selected just by considering the column weights among both the systematic bits and the parity bits. In the example of FIG. 5, the reordered codeword in a descending order according to each corresponding column weight will be $a_{11}, a_1, a_3, a_5, a_6, a_7, a_4, a_8, a_9, a_{10}, a_{12}$, and $a_2$. If a size of a transmission channel is 18 bits, the top six bits corresponding to six columns having the biggest weights among the reordered codeword will be repeated. Assuming the six repeated bits are $b_1, b_3, b_5, b_6, b_7$, and $b_{11}$ where $b_k$=$a_k$, the bits to be transmitted are $a_1, a_2, a_3, a_4, a_5, a_6, a_7, a_8, a_9, a_{10}, a_{11}, a_{12}, b_1, b_3, b_5, b_6, b_7$, and $b_{11}$. It is preferable to repeat bits corresponding to columns having an equal weight prior to a preceding or following bit.

Next, a procedure for adjusting the codeword size by puncturing in the repetition/puncturing module 42 will be described below.

When the size of the codeword outputted from the LDPC coding module 41 is 'n' bits and the size of the transmission channel is 't' bits where n>t, the size of the codeword should be adjusted to be matched to the size of the transmission channel by puncturing (n−t) number of bits among the codeword. Bits to be punctured are preferably selected among the parity bits in consideration of a column weight of the parity check matrix H corresponding to each bit. Namely, it is desirable that some of the parity bits which are less related to the source data are punctured in an ascending order according to the column weight since a bit corresponding to a column having a bigger weight has robustness to errors during transmission. Some of the systematic bits may be repeated in case that the size of the codeword cannot be matched to the size of the transmission channel with the parity bits only.

In the example of FIG. 5, the parity bits reordered in an ascending order according to the weight of each column $W_k$ are $a_{12}, a_{10}, a_9, a_8, a_7$, and $a_{11}$. If a size of a transmission channel is 8 bits, the bottom four bits corresponding to four columns having the smallest weights among the parity bits are punctured. The bits to be transmitted are $a_1, a_2, a_3, a_4, a_5, a_6, a_7$, and $a_{11}$. If a size of a transmission channel is 4 bits, all parity bits and the bottom two bits corresponding to two columns having the smallest weights among the systematic bits are punctured. In this case, the bits to be transmitted are $a_1, a_3, a_5$, and $a_6$.

As another embodiment, bits to be punctured can be selected just by considering the column weights among both the systematic bits and the parity bits. In the example of FIG. 5, the reordered codeword in an ascending order according to each corresponding column weight will be $a_2, a_{12}, a_{10}, a_9, a_8, a_4, a_7, a_6, a_5, a_3, a_1$, and $a_{11}$. If a size of a transmission channel is 5 bits, the bottom seven bits corresponding to seven columns having the smallest weights among the reordered codeword will be punctured, so that the bits to be transmitted are $a_1, a_3, a_5, a_6$, and $a_{11}$. It is preferable to perform puncturing bits corresponding to columns having an equal weight prior to a preceding or following bit.

The digital modulation module 43 performs symbol mapping by digital modulation for the codeword outputted from the repetition/puncturing module 42. One of QPSK, 16-QAM, and 64-QAM, etc can be used as a digital modulation scheme.

The symbol sequence outputted from the digital modulation module 43 is inputted into the OFDM data processing module 44 in which the symbol sequence is modulated by an OFDM modulation scheme for orthogonal frequency division transmission and the antenna 45 transmits signals from the OFDM data processing module 44. Here, the OFDM modulation scheme may include a series of procedures for data processing which are generally needed for transmitting signals by an OFDM scheme, the series of procedures comprising serial-to-parallel conversion, Inverse Fast Fourier Transform (IFFT), and guard interval insertion, etc. A detailed explanation for the OFDM modulation scheme will be abridged since it is publicly known knowledge.

Referring to FIG. 4B, the receiver 50 comprises an antenna receiving signals from a transmitting side, an OFDM data de-processing module 52 extracting symbols from the received signals by an OFDM demodulation scheme, a digital demodulation module 53 recovering data sequence by de-mapping the symbols outputted from the OFDM data de-processing module 52, a repetition/puncturing recover module 54 recovering a codeword from the data sequence which is repeated or punctured in the transmitting side, and an LDPC decoding module 55 outputting source data by decoding the codeword with a parity check matrix H.

Each of the OFDM data de-processing module 52 and the digital demodulation module 53 corresponding to the OFDM data processing module 44 and the digital modulation module 43 of the transmitter 40, respectively performs a reverse procedure of each of the OFDM data processing module 44 and the digital modulation module 43, so that a detailed explanation for them will be abridged.

An operating process of the repetition/puncturing recover module 54 will be followed with specific examples in cases of repetition and puncturing in the repetition/puncturing module 42 of the transmitter 40.

In the example of FIG. 5, the reordered codeword in a descending order according to each corresponding column weight will be $a_{11}, a_1, a_3, a_5, a_6, a_7, a_4, a_8, a_9, a_{10}, a_{12}$, and $a_2$. If a size of a transmission channel is 18 bits, the top six bits corresponding to six columns having the biggest weights among the reordered codeword will be repeated. Assuming the six repeated bits are $b_1, b_3, b_5, b_6, b_7$, and $b_{11}$ where $b_k = a_k$, the bits to be transmitted are $a_1, a_2, a_3, a_4, a_5, a_6, a_7, a_8, a_9, a_{10}, a_{11}, a_{12}, b_1, b_3, b_5, b_6, b_7$, and $b_{11}$.

Assuming a data sequence received in the receiving side through radio channel is $a'_k$, the received data sequence of 18 bits are $a'_1, a'_2, a'_3, a'_4, a'_5, a'_6, a'_7, a'_8, a'_9, a'_{10}, a'_{11}, a'_{12}, b'_1, b'_3, b'_5, b'_6, b'_7, b'_{11}$. The repetition/puncturing recover module 54 of the receiver 50 recovers the original 12 bits of data sequence by combining each of the six repeated bits with each of the original bits corresponding to each of the repeated bits.

In the example of FIG. 5, if a size of a transmission channel is 5 bits, the bottom seven bits corresponding to seven columns having the smallest weights among the reordered codeword will be punctured, so that the bits to be transmitted are $a_1, a_3, a_5, a_6$, and $a_{11}$. Assuming a data sequence received in the receiving side through radio channel is $a'k$, the received data sequence of 5 bits are $a'_1, a'_3, a'_5, a'_6, a'_{11}$. The repetition/puncturing recover module 54 of the receiver 50 recovers the original 12 bits of data sequence by filling the punctured position with '0'. The LDPC decoding module 55 decodes the data sequence outputted from the repetition/puncturing recover module 54.

The receiver 50 should have information associated with bits repeated or punctured in the transmitter 40 like bit locations, etc. The receiver 50 may obtain the information by calculating in a pre-defined way with the parity check matrix stored in the receiver 50 or receiving the information from the transmitter 50.

The LDPC decoding module 55 extracts the source data by decoding the data sequence outputted from the repetition/puncturing recover module 54 by using the parity check matrix H.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

A method and a transmitter for adjusting codeword size in a mobile communication system in accordance with the present invention may have the following effects.

First, an arbitrary size of transmission channel can be used without considering a size of a parity check matrix H when using an LDPC coding or decoding scheme. In other words, the size of the parity check matrix H can be designed irrespective of a size of a transmission channel.

Second, characteristics of the parity check matrix H can be considered when adjusting the codeword size, thereby optimizing the performance.

INDUSTRIAL APPLICABILITY

The present invention is applicable to a wireless communication system such as a mobile communication system or a wireless internet system, etc.

The invention claimed is:

1. A method of adjusting a codeword size in a communication system supporting a low density parity check (LDPC) coding scheme, the method comprising:
   encoding source data into a codeword by using a parity check matrix having a plurality of columns, the codeword having a size of 'n' bits; and
   adjusting the size of the codeword such that the adjusted size of the codeword matches a size of a transmission channel, the size of the transmission channel being 't' bits,
   wherein adjusting the size of the codeword comprises:
      if 'n' is less than 't', repeating |t−n| bits of the codeword corresponding to |t−n| columns of the parity check matrix having largest column weights among the plurality of columns; and
      if 'n' is greater than 't', puncturing |t−n| bits of the codeword corresponding to |t−n| columns of the parity check matrix having smallest column weights among the plurality of columns.

2. The method of claim 1, wherein repeating |t−n| bits of the codeword comprises preferentially repeating systematic bits of the codeword.

3. The method of claim 1, wherein repeating |t−n| bits of the codeword comprises adding the repeated bits to a tail end of the codeword.

4. The method of claim 1, wherein puncturing |t−n| bits of the codeword comprises preferentially puncturing parity bits of the codeword.

5. A transmitter in a communication system supporting a low density parity check (LDPC) coding scheme, the transmitter comprising:
 an LDPC coding module configured to encode source data into a codeword by using a parity check matrix having a plurality of columns, the codeword having a size of 'n' bits; and
 an adjusting module configured to adjust the size of the codeword such that the adjusted size of the codeword matches a size of a transmission channel, the size of the transmission channel being 't' bits,
 wherein the adjusting module is further configured to adjust the size of the codeword by:
  if 'n' is less than 't', repeating |t−n| bits of the codeword corresponding to |t−n| columns of the parity check matrix having largest column weights among the plurality of columns; and
  if 'n' is greater than 't', puncturing |t−n| bits of the codeword corresponding to |t−n| columns of the parity check matrix having smallest column weights among the plurality of columns.

6. The transmitter of claim 5, wherein the adjusting module is further configured to repeat |t−n| bits of the codeword by preferentially repeating systematic bits of the codeword.

7. The transmitter of claim 5, wherein the adjusting module is further configured to add the repeated bits to a tail end of the codeword.

8. The transmitter of claim 5, wherein the adjusting module is further configured to puncture |t−n| bits of the codeword by preferentially puncturing parity bits of the codeword.

* * * * *